United States Patent [19]

Schüssler et al.

[11] Patent Number: 5,299,098

[45] Date of Patent: Mar. 29, 1994

[54] DISTRIBUTION RACK

[75] Inventors: Reiner Schüssler; Lutz Biederstedt, both Berlin, Fed. Rep. of Germany; Markus Springer, Cheltenham, England

[73] Assignee: Krone Aktiengesellschaft, Berlin, Fed. Rep. of Germany

[21] Appl. No.: 17,241

[22] Filed: Feb. 12, 1993

[30] Foreign Application Priority Data

Feb. 13, 1992 [DE] Fed. Rep. of Germany ....... 4204558

[51] Int. Cl.$^5$ .............................................. H02B 1/01
[52] U.S. Cl. .................................... 361/829; 361/725
[58] Field of Search ............... 361/332, 334, 340, 346, 361/391, 426, 428–432

[56] References Cited

U.S. PATENT DOCUMENTS

| | | | |
|---|---|---|---|
| 2,994,807 | 8/1961 | Devine et al. | 361/391 |
| 3,188,524 | 6/1965 | Williams | 361/391 |
| 3,320,488 | 5/1967 | Karew et al. | 361/391 |
| 4,160,880 | 7/1979 | Brey | 361/428 |
| 4,777,559 | 10/1988 | Bar et al. | 361/340 |

FOREIGN PATENT DOCUMENTS 623698 6/1981 Fed. Rep. of Germany .

Primary Examiner—Gregory D. Thompson
Attorney, Agent, or Firm—McGlew and Tuttle

[57] ABSTRACT

The invention relates a distribution rack, for cable distribution devices used in telecommunication and data technology. The distribution rack includes at least one base portion 1 and at least one swing frame 3 provided with termination modules 4 and pivotingly supported at the base portion 1 about a swing axis 13 provided at one side thereof. In order to improve the accessibility to the cable duct behind the swung-in swing frame and to facilitate wiring of the cutting and clamping contact elements 5 of the termination modules 4 with cable cores, the invention provides that the swing axis 13 of the swing frame 3 at the base portion 1 is retractably supported. Thereby, with the swing frame 3 retracted and swung-out, fully free accessibility to the cable duct 42 beside the base portion and behind the swing frame 3 is made possible. Further, the cutting and clamping contact elements 5 of the termination modules 4 on the swing frame 3 are particularly easily accessible.

10 Claims, 6 Drawing Sheets

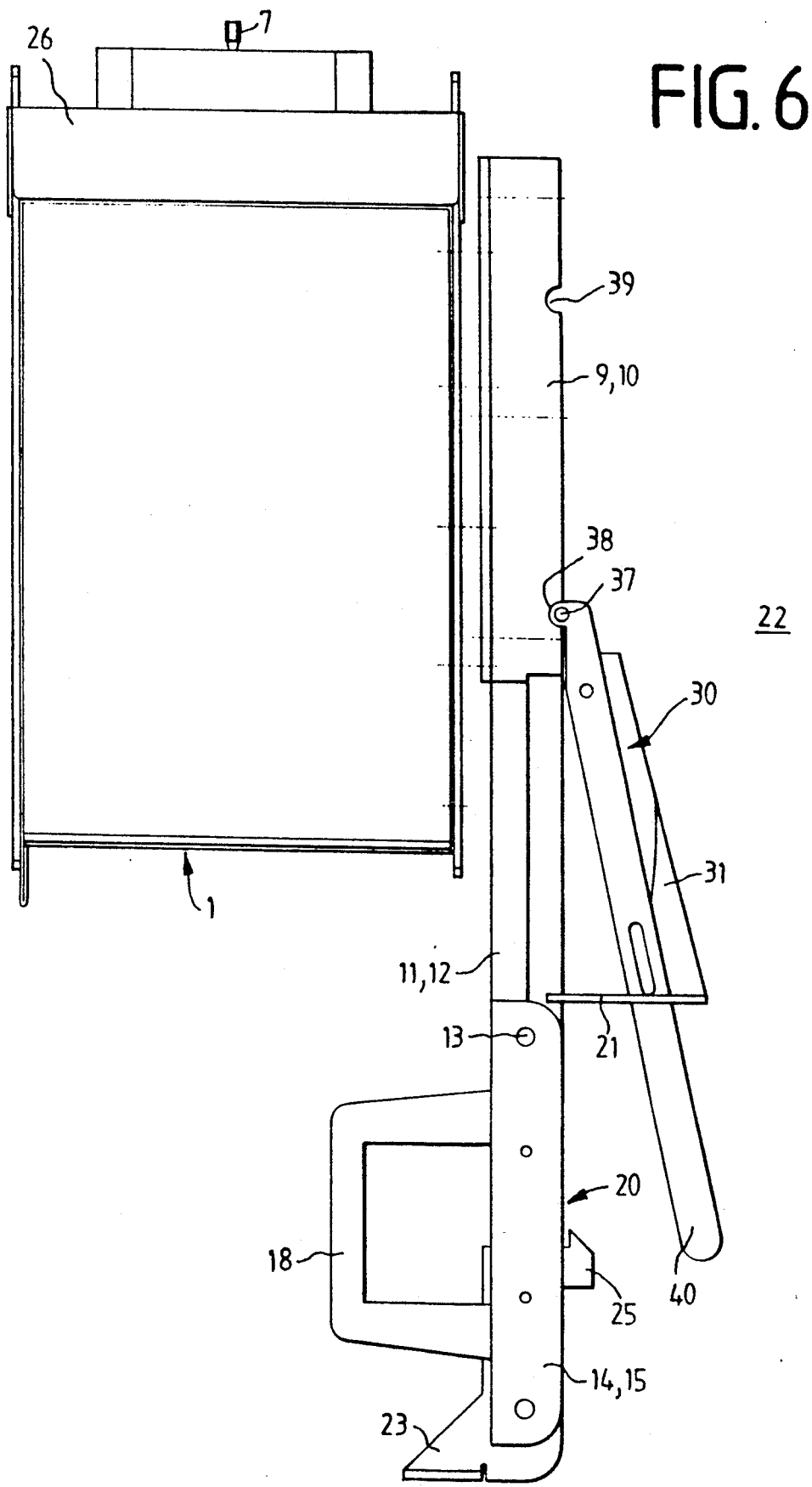

DISTRIBUTION RACK

FIELD OF THE INVENTION

The invention relates to a distribution rack, and in particular to a distribution rack for cable distribution devices used in telecommunication and data technology. The distribution rack includes at least one base portion and at least one swing frame provided with termination modules and pivotingly supported at the base portion about a swing axis provided at one side thereof.

BACKGROUND OF THE INVENTION

A distribution rack of the aforementioned species is known in the art from CH-PS 623.698. In this wall jumper distribution rack for a house telephone system, several bearing blocks are attached at two base portions disposed in the distribution rack and formed of U-section carries, at the bearing blocks swing frames provided with termination modules being pivotingly supported, about their one-sidedly disposed swing axis. Swingability of the swing frames is intended to permit a good accessibility to the cable ducts behind the flapped-in swing frame, and to facilitate the termination of cable cores at the termination modules in the swing frames. It is disadvantageous however, herein, that the cable ducts are not accessible in optimum manner for wiring operations, with a flapped out swing frame, and that wiring of the sections of the termination modules in the neighborhood of the swing axis is nearly impossible, with a flapped-out swing frame. This is especially true since this section of the termination modules is close to an adjacent section of the base portion, and is not freely accessible.

SUMMARY AND OBJECTS OF THE INVENTION

It is therefore the object of the invention to improve a distribution rack of the aforementioned species such that accessibility to the cable ducts behind the swing frames are provided with termination modules as well as with accessibility to the cutting and clamping contact elements of the termination modules when wiring is considerably improved.

This object is achieved, according to the invention, by retractably supporting the swing axis of the swing frame at the base portion. By retracting the swing frame from the distribution rack, accessibility is provided to the cable ducts behind the swing frames, which are provided with termination modules, and thus to the connection cables guided there. Also accessibility to the cutting and clamping contact elements of the termination modules when wiring is considerably improved.

Another feature of the invention provides that the swing axis of the swing frame is disposed on guide rails, which are retractably supported in a guide attached at the base portion. Further, a first latch element is provided at the swing frame for preventing a swing movement, and a second latch element is provided for preventing the retract movement. The latch elements being capable of being unlocked for swinging the termination frame out and for retracting the latter.

It is particularly advantageous to adapt the base rack and the swing frame with its guides and guide rails as one unit. The base rack forms an active rack for sliding in units e.g. plug-in boards, printed-circuit boards and the like, and the swing frame forms the passive mounting frame to be provided with the termination modules. Such a combination of an empty slide-in housing and a mounting frame provided with termination modules can be prewired in the factory, and needs only be placed, without a large wiring effort, in a distribution device at the installation site. The base rack is in particular a 19" rack.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the drawings:

FIG. 6 is a top view of the distribution rack with a retracted and swing frame swung-out by 90°.

DETAILED DESCRIPTION OF THE PREFERRED EMBODIMENT

Figure 1:
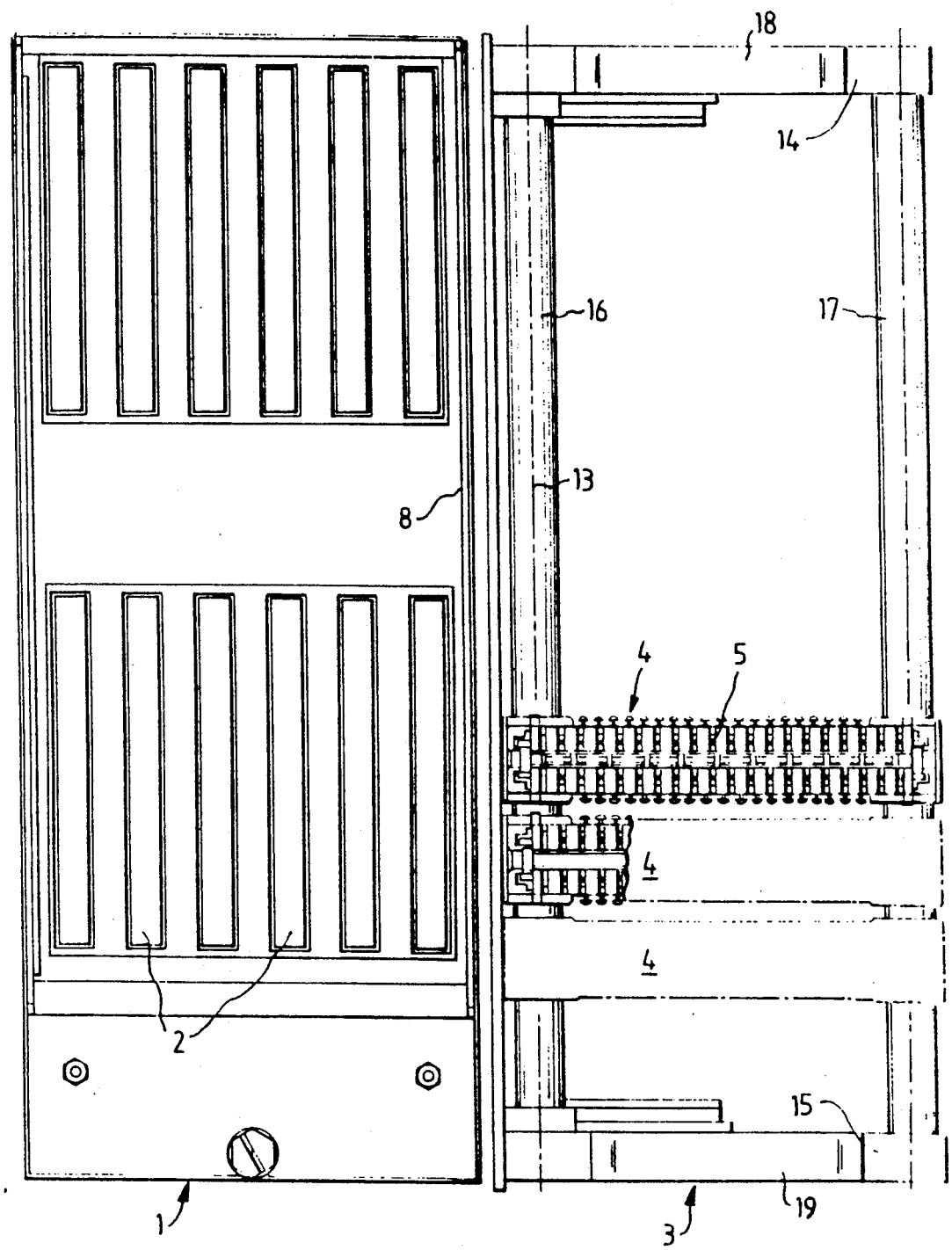
FIG. 1 is a front view of the distribution rack with termination modules disposed on the swing frame.

The distribution rack comprises a base portion 1, which is adapted for receiving plug-in units 2, such as plug-in boards, printed-circuit boards or the like, and a swing frame 3 assigned thereto and provided with termination modules 4. Connection cables, which are not shown in the drawings, extend between cutting and clamping contact elements 5 of the termination modules 4 and the plug-in units 2 of the base portion 1.

Figure 2:
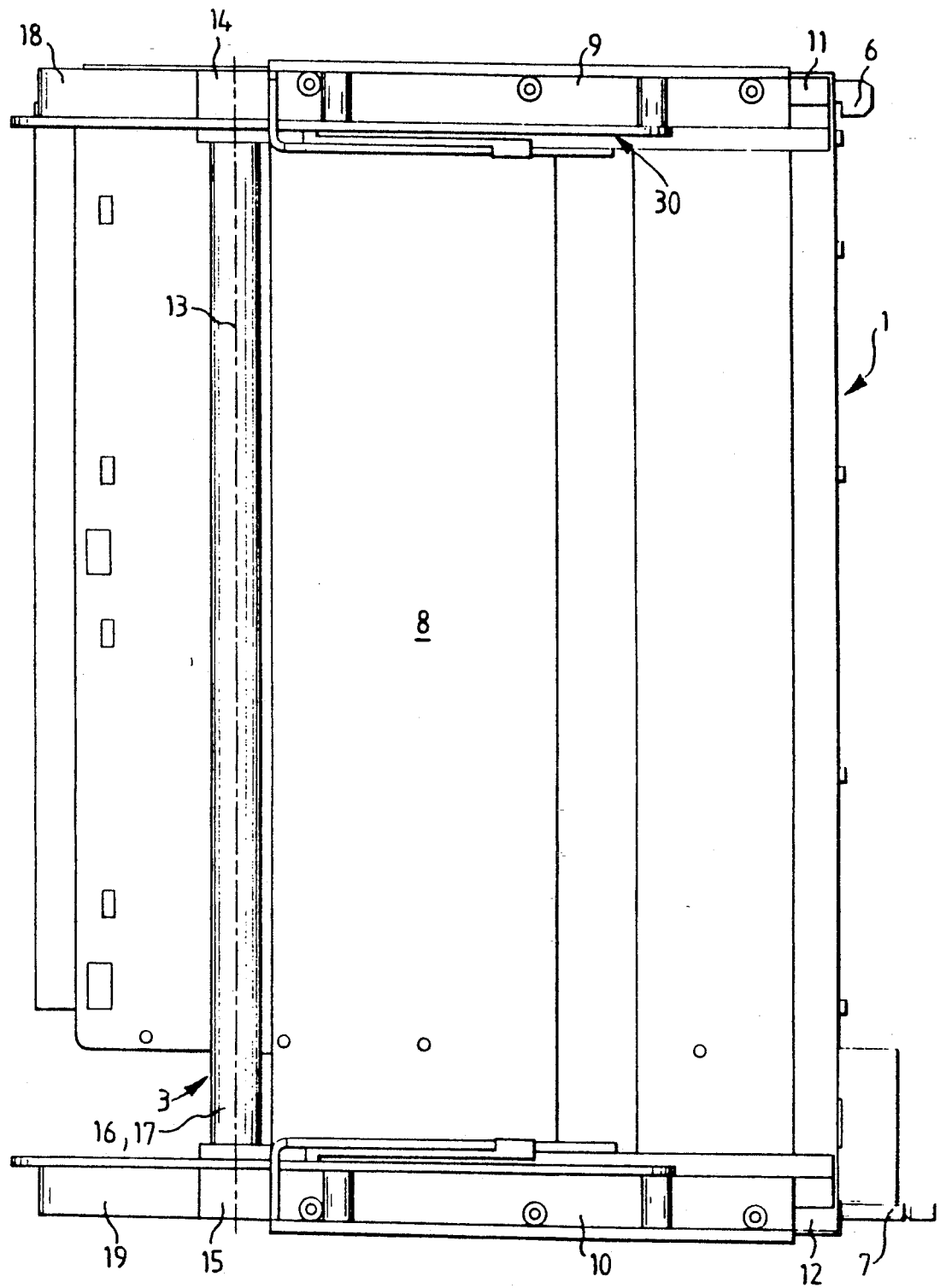
FIG. 2 is a side view of the distribution rack without showing the termination modules.

The base portion 1 is formed of a box-type housing which can be fixed in a distribution device, e.g. a distribution panel or the like, by means of hooks 6 and screws 7, shown in FIG. 2, disposed on the back thereof. At the one side wall 8 of the base portion 1, a connection means between the base portion and the swing frame includes upper and lower base guides 9, 10 for guide rails 11, 12 held therein are screwed on. The guide rails 11,12 carrying, at their front ends, a swing axis or pivot 13, for the swing frame 3 connecting the guide rails 11,12. The swing frame comprises two parallel round-section bars 16, 17 being held spaced apart by frame web plates 14, 15 and serving for the latching of the termination modules 4. At the web plates 14, 15 there are attached handles 18 or 19, resp., serving for handling the swing frame 3.

At the swing frame 3 is formed a first latch element 20, for preventing a swing or pivotal movement about swing axis 13, and also a second latch element 30, for preventing a retraction movement of the swing frame 3. Each of the first and second latch elements 20, 30 can be unlocked for swinging or retracting the swing frame 3. Latch elements 20, 30 are each disposed in the area of the upper and lower guides 9, 10, of the guide rails 11, 12 and of the web plates 14, 15, in identical shapes.

The first latch element 20 is formed of a spring loaded latch lug 25 engaging behind a first latch plate 21 attached at the respective guide rail 11, 12, and provided with an unlocking handle 23. The latch element 20 is slidably supported, parallel to the respective web plate 14, 15, and secures, with the latch lug 25 engaged behind the plate 21, the swing frame 3 against swinging. For swinging the swing frame 3 out, both unlocking handles 23 have to be simultaneously pressed.

The second latch element 30 is adapted as a two arm or end, spring-loaded lever arm 33 pivotingly mounted at a second latch web plate 31 of the respective guide rail 11, 12. The rotation axis or axle 35 of the lever arm 33 being spaced from the swing frame 3. Spring-loading is achieved by a blade spring 36. The one end of the lever arm 33 is adapted as a latch lug, provided with a roller 37. The latch lug engaging into one of latches formed at the guides 9, 10. The other end of the two-arm lever arm 33 passes through the swing frame 3 in the area of the web plates 14, 15, in the flapped-in position, and serves as an actuation handle 40. Near to the web plate 14, being formed as one piece with the web plate 31, an oblong hole 32 is provided in the lever arm 33, into which engages a lug 34 of the blade spring 36.

Figure 3:
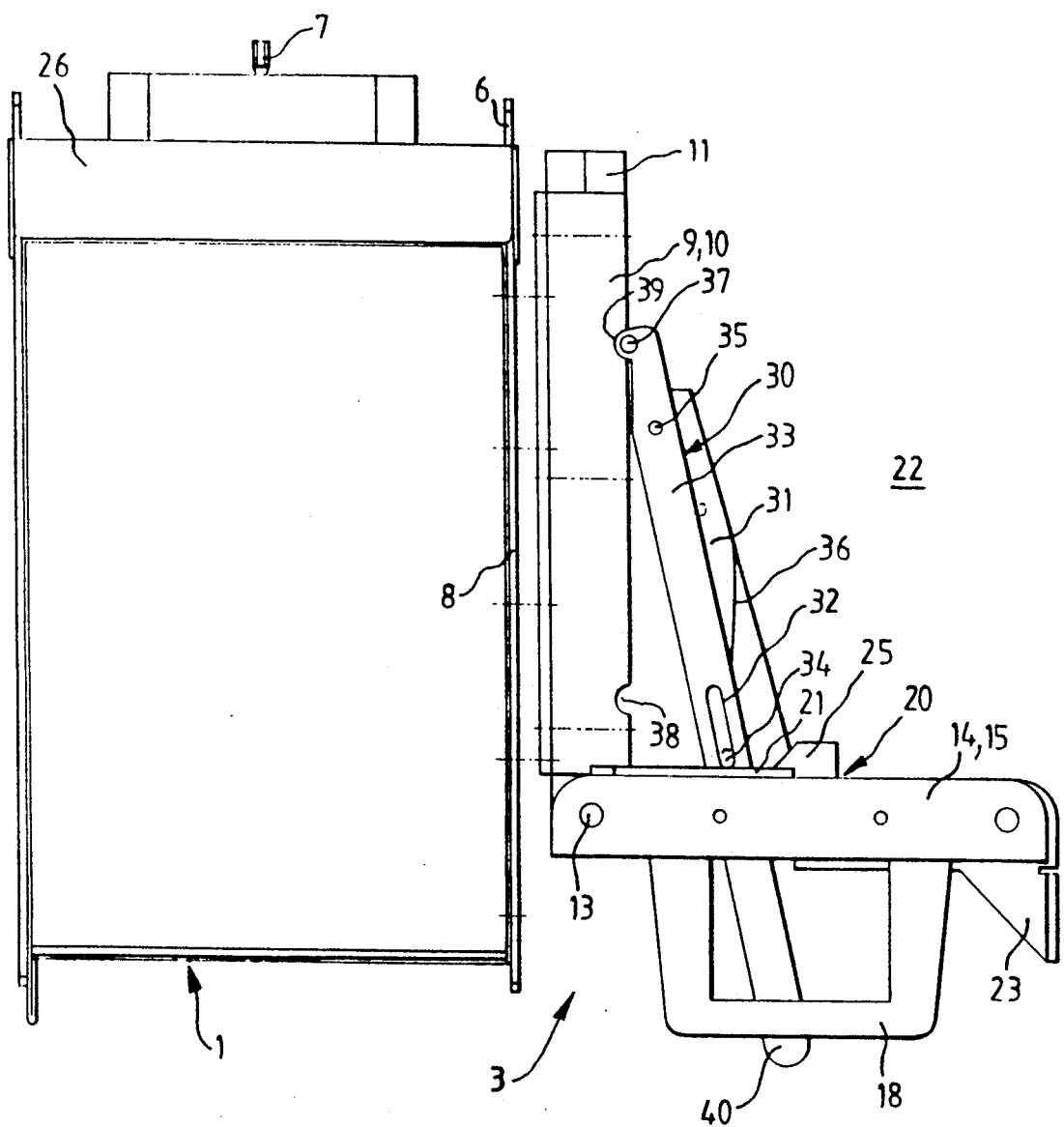
FIG. 3 is a top view of the distribution rack with a swung-in and slid-in swing frame.
Figure 4:
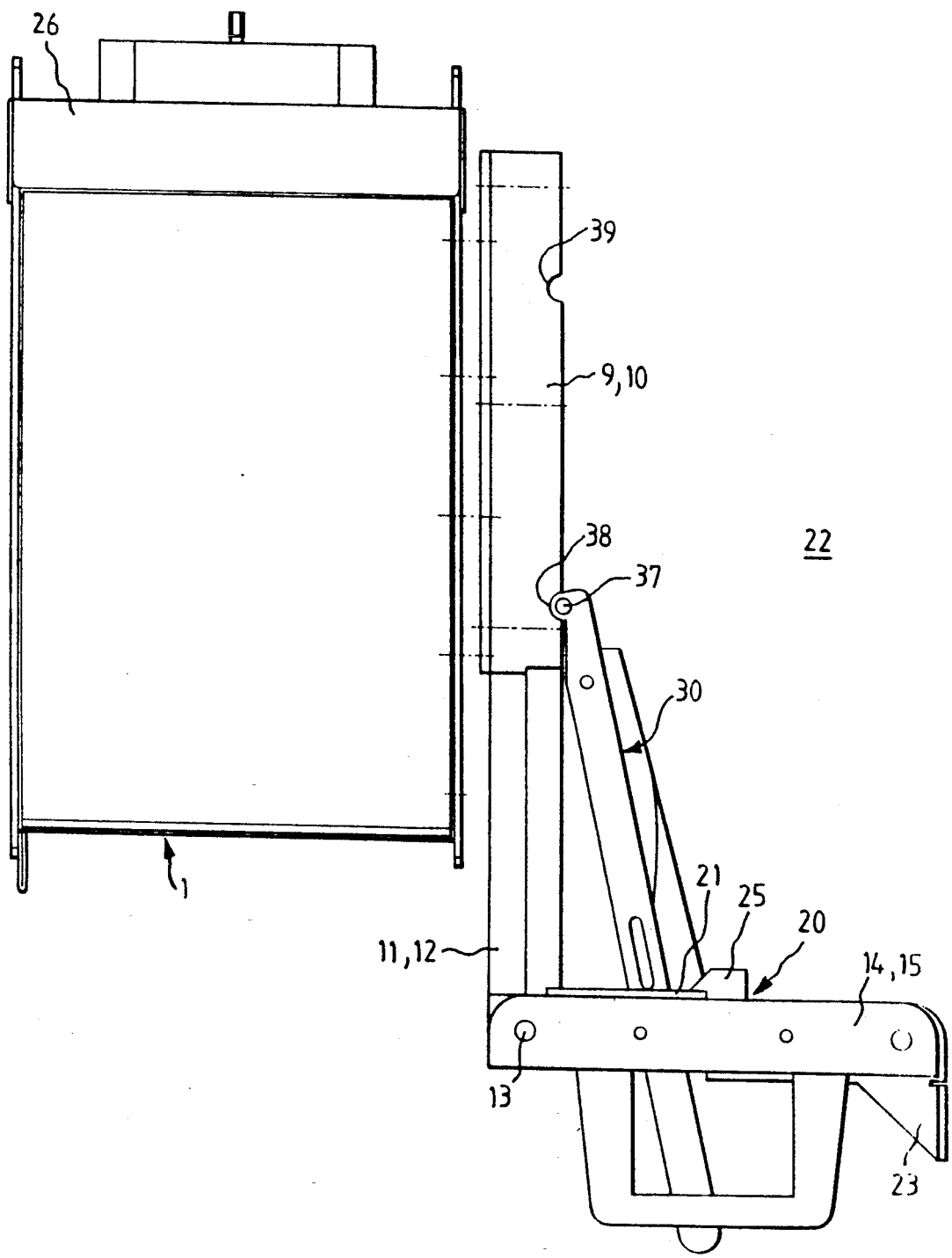
FIG. 4 is a top view of the distribution rack with a retracted swing frame.
Figure 5:
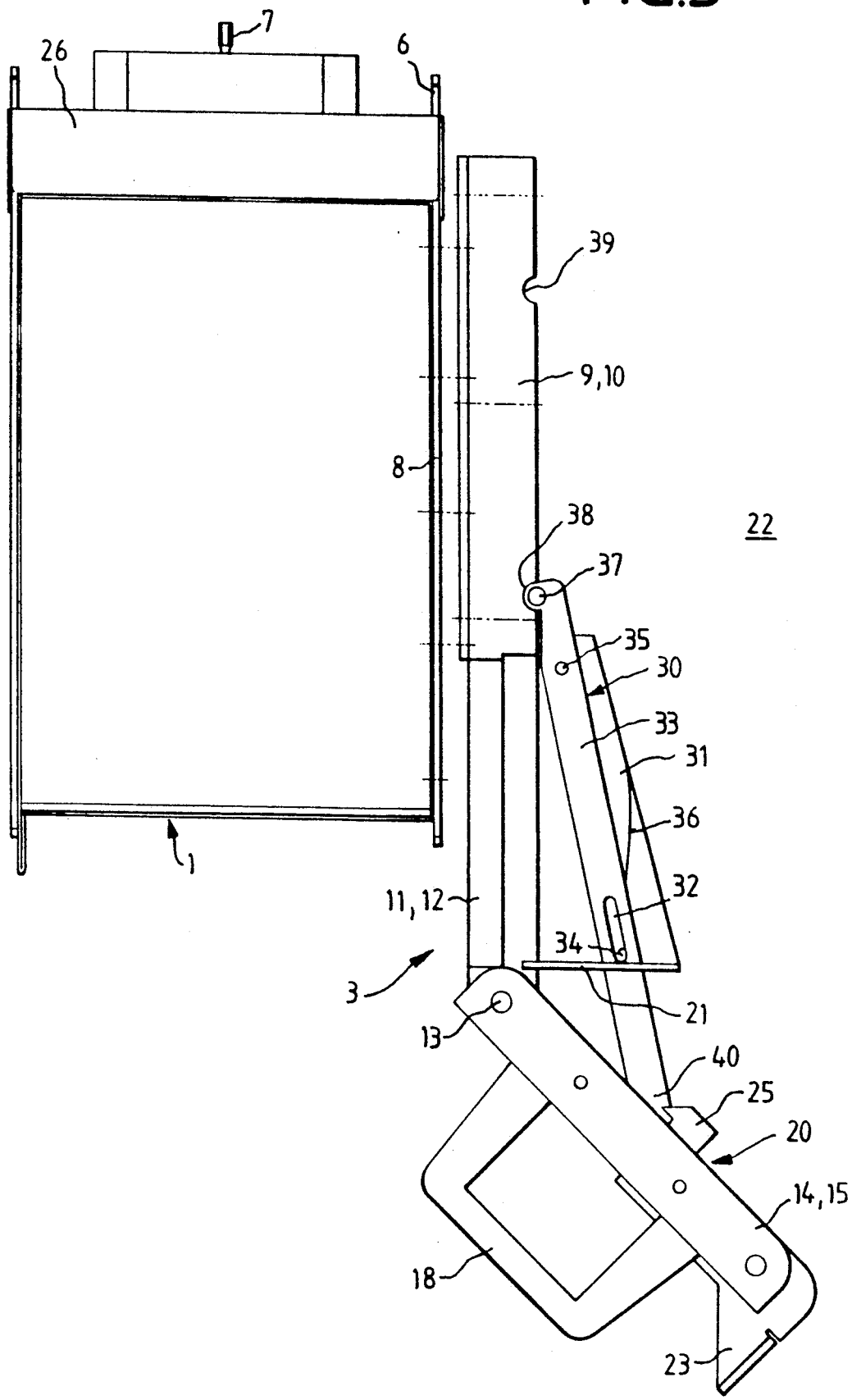
FIG. 5 is a top view of the distribution rack with a retracted and swing frame swung out by 45°.

The swing frame 3 is shown in a top view, in FIG. 3, in its slid-in and flapped-in position, and can be advanced by unlocking the lever arm 33 of the second latch element 30. The roller 37 coming out of engagement with the latch 39, from its slid-in position to its retracted position according to FIG. 4. The guide rails 11, 12 sliding in the guides 9, 10. The roller 37 engages, in the retracted position, into the latch 38, as is shown in FIG. 4. Subsequently, by unlocking the first latch element 20, the swing frame 3 can be swung out, for which purpose both unlocking handles 23 have to be actuated so to bring both latch lugs 25 out of engagement with the associated plates 21. The swing frame 3 can now be swung out, over the 45° position shown in FIG. 5, into the 90° position shown in FIG. 6. In this position, an easy access to the cable duct 22 besides the base portion 1 and behind the swung-in swing frame 3 is possible. Further, it is easy to wire the cutting and clamping contact elements 5 of the termination modules 4, since they are now fully outside the area of the base portion 1. A particular advantage is that, when the base portion 1 together with the swing frame 3 is pre-assembled and pre-wired in the factory. The base portion 1 has, on its inner wall, plug connector banks 26. The individual contact pins of which can be pre-wired by means of connection cables on the outer side of the base portion 1 with the respective cutting and clamping contact elements 5 of the termination modules 5 placed onto the swing frame 3. The complete combination of a base portion 1 with swing frame 3 and the pre-wired termination modules 4 can then be inserted by means of the hooks 6 and the screws 7 into a distribution box on the installation site.

While specific embodiments of the invention have been shown and described in detail to illustrate the application of the principles of the invention, it will be understood that the invention may be embodied otherwise without departing from such principles.

What is claimed is:

1. A distribution rack for telecommunication and data distribution devices, the rack comprising:
    a base portion;
    a swing frame positioned on a side of said base portion;
    connection means for connecting said base portion to said swing frame, said connection means guiding said swing frame in a retraction movement and a pivotal movement, said connection means includes base guides attached to said base portion, and guide rails movable on said base guides, said connection means also includes a swing pivot connecting said swing frame to said guide rails; and
    termination modules attached to said swing frame.

2. A rack in accordance with claim 1, further comprising;
    first latch means for latching said swing frame against said pivotal movement; and
    second latch means for latching said swing frame against said retraction movement.

3. A rack in accordance with claim 2, wherein;
    said first latch means includes a first latch plate connected to one of said guide rails, and a latch lug means for engaging behind said first latch plate, said first latch means also including an unlocking handle.

4. A rack in accordance with claim 3, wherein;
    said latch lug means is spring-loaded.

5. A rack in accordance with claim 2, wherein;
    said second latch means includes a latch defined by one of said base guides, and a second latch web plate mounted on one of said guide rails, said second latch means also including a lever arm pivotally mounted on said second latch web plate, said lever arm having a latch lug for engaging with said latch defined by said one of said base guides, said lever arm also having another end extending through said swing frame and forming an actuation handle.

6. A rack in accordance with claim 5, wherein;
    said lever arm is spring loaded; and
    said latch lug of said lever arm includes a roller.

7. A rack in accordance with claim 2, wherein;
    one of said base guides defines first and second latches for slid-in and retracted positions of said swing frame.

8. A rack in accordance with claim 1, wherein;
    said swing frame includes two substantially parallel round section bars held spaced apart by frame web plates, said substantially parallel round section bars form latching means for latching said terminal units.

9. A rack in accordance with claim 1, wherein;
    said base portion, said swing frame and said connection means form a constructional unit.

10. A telecommunication and data distribution rack comprising:
    a base portion including hook and screw means on a back of said base portion for attaching said base portion to a distribution panel;
    a swing frame positioned on a side of said base portion;
    connection means for connecting said base portion to said swing frame, said connection means guiding said swing frame in a lateral movement substantially parallel to said side of said base portion and said connection means guiding said swing frame in a pivotal movement about a swing frame pivot axis also substantially parallel to said side of said base portion, and said swing frame pivot axis being substantially perpendicular to said lateral movement; and
    termination modules attached to said swing frame.

* * * * *